(12) United States Patent
Shin et al.

(10) Patent No.: US 8,034,640 B2
(45) Date of Patent: Oct. 11, 2011

(54) APPARATUS AND METHOD TO INSPECT DEFECT OF SEMICONDUCTOR DEVICE

(75) Inventors: Ji-Young Shin, Seoul (KR); Young-Nam Kim, Suwon-si (KR); Jong-An Kim, Seoul (KR); Hyung-Suk Cho, Hwaseong-si (KR); Yu-Sin Yang, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/627,222

(22) Filed: Nov. 30, 2009

(65) Prior Publication Data

US 2010/0136717 A1    Jun. 3, 2010

(30) Foreign Application Priority Data

Nov. 28, 2008    (KR) .................. 10-2008-0119887

(51) Int. Cl.
  *G01R 31/26* (2006.01)
  *H01L 21/66* (2006.01)
(52) U.S. Cl. .................. 438/14; 438/18; 257/E21.53
(58) Field of Classification Search .............. 438/14–18; 257/E21.53; 250/300–310
See application file for complete search history.

(56) References Cited

U.S. PATENT DOCUMENTS

| | | | | |
|---|---|---|---|---|
| 5,227,651 A | * | 7/1993 | Kim et al. | 257/309 |
| 2002/0142496 A1 | * | 10/2002 | Nakasuji et al. | 438/14 |
| 2003/0205678 A1 | * | 11/2003 | Notte, IV | 250/423 F |
| 2006/0011837 A1 | * | 1/2006 | Jee et al. | 250/311 |
| 2006/0151700 A1 | * | 7/2006 | Honda et al. | 250/310 |
| 2009/0108199 A1 | * | 4/2009 | Liu et al. | 250/310 |

FOREIGN PATENT DOCUMENTS

| | | |
|---|---|---|
| JP | 2006-196281 | 7/2006 |
| KR | 2005-18478 | 2/2005 |
| KR | 2006-70003 | 6/2006 |

* cited by examiner

*Primary Examiner* — Charles Garber
*Assistant Examiner* — Abdulfattah Mustapha
(74) *Attorney, Agent, or Firm* — Stanzione & Kim, LLP (57) ABSTRACT

An apparatus and method to inspect a defect of a semiconductor device. The amount of secondary electrons generated due to a scanning electron microscope (SEM) may depend on the topology of a pattern of a semiconductor substrate. The amount of secondary electrons emitted from a recess of an under layer is far smaller than that of secondary electrons emitted from a projection of a top layer. Since the recess is darker than the projection, a ratio of a value of a secondary electron signal of the under layer to a value of a secondary electron signal of the top layer may be increased in order to improve a pattern image used to inspect a defect in the under layer. To do this, a plurality of conditions under which electron beams (e-beams) are irradiated may be set, at least two may be selected out of the set conditions, and the pattern may be scanned under the selected conditions. Thus, secondary electron signals may be generated according to the respective conditions and converted into image data so that various pattern images may be displayed on a monitor. Scan information on the pattern images may be automatically stored in a computer storage along with positional information on a predetermined portion of the semiconductor substrate. When calculation conditions are input to a computer, each of scan information on the pattern images may be calculated to generate a new integrated pattern image.

19 Claims, 10 Drawing Sheets

A) Voltage 1000;Current high

FIG.5

B) Voltage 2000;Current high

(a) Voltage 1000;Current high

FIG.9

ⓑVoltage 2000;Current extra

FIG.10

ⓒVoltage 600;Current extra

APPARATUS AND METHOD TO INSPECT DEFECT OF SEMICONDUCTOR DEVICE

CROSS-REFERENCE TO RELATED APPLICATIONS

This application claims priority under Korean Patent Application No. 10-2008-0119887, filed Nov. 28, 2008, the contents of which are hereby incorporated herein by reference in their entirety.

BACKGROUND

1. Field of the Invention

Example embodiments relate to an apparatus and method to inspect defects of a semiconductor device in which multiple conditions of electron beams (e-beams) are determined, signals corresponding to secondary electrons generated under the respective conditions are scanned as a plurality of pattern images, and the plurality of pattern images are subtracted to generate a new pattern image.

More specifically, example embodiments relate to an apparatus and method to inspect defects of a semiconductor device in which when a plurality of pattern images are scanned and respectively calculated, secondary electron signals in a top layer may counterbalance each other, while secondary electron signals in an under layer may be amplified, thus generating a new pattern image in which a recess of the under layer becomes almost as clear as a projection of the top layer.

2. Description of the Related Art

In general, fabrication of a semiconductor device involves forming a predetermined material layer on a wafer and patterning the material layer. The patterning process may be followed by a process of inspecting whether a pattern has the same shape and line width as designed or whether there is a defect in the pattern.

A scanning electron microscope (SEM) is typically used to measure the line width of the pattern and detect defects in the pattern. A method of measuring the line width of the pattern using the SEM involves irradiating e-beams onto the pattern formed on the wafer, forming a pattern image by converting a signal corresponding to secondary electrons emitted from the pattern into an image signal, and measuring the line width of the pattern using the pattern image. Also, defects or particles may be detected in the pattern by use of the pattern image obtained using the SEM.

SUMMARY

Example embodiments provide an apparatus and method to inspect defects of a semiconductor device, which improve a pattern image of an under layer to detect a defect from the under layer that is darker than a top layer.

Additional aspects and utilities of the present general inventive concept will be set forth in part in the description which follows and, in part, will be obvious from the description, or may be learned by practice of the general inventive concept.

According to example embodiments, a method of inspecting a defect of a semiconductor device includes: fabricating a semiconductor device by etching a desired pattern in a stacked layer, the pattern having a step height between a top layer and an under layer; scanning a pattern image on the top layer and the under layer using electron beams (e-beams); processing the pattern image by storing and calculating each scan information by varying conditions under which the e-beams are irradiated; and reviewing a defect included in the pattern of the semiconductor device using integrated image information.

The fabrication of the semiconductor device may include performing a selective epitaxial growth (SEG) process in which silicon is not grown in an insulating layer, while only silicon is selectively grown on an exposed portion of a silicon substrate. In this case, the grown portion of the silicon substrate and the ungrown insulating layer may correspond to the top layer and the under layer, respectively.

The fabrication of the semiconductor device may include performing a via contact layer process to connect interlayer interconnections of the insulating layer of the semiconductor layer having a stacked structure. In this case, an upper surface of the insulating layer and an upper surface of the interconnection may correspond to the top layer and the under layer, respectively.

The scanning of the pattern image may include: irradiating e-beams onto the semiconductor device; generating secondary electrons from the semiconductor device; detecting a secondary electron signal using a scintillator of a detector; converting the secondary electron signal into an electrical signal; amplifying the secondary electron signal using an amplifier; and converting the electrical signal into a digital signal and displaying the pattern image on a monitor.

The varying of the conditions under which the e-beams are irradiated may include selecting a plurality of conditions in order to obtain various pattern images, previously setting the plurality of conditions in consideration of several expected variables instead of setting the plurality of conditions according to circumstances, and allowing an operator to easily select the plurality of conditions using a button during an operation.

The processing of the pattern image may include: scanning images of a plurality of patterns by varying the intensity of the e-beams and storing the images of the patterns; and calculating the images of the patterns at different intensities of the e-beams to generate a new pattern image.

The calculation of each scan information may be performed using subtraction to increase a ratio of a pattern image of the under layer to a pattern image of the top layer. The ratio may be indicated by a secondary electron signal.

A ratio (%) of a secondary electron signal of the under layer to a secondary electron signal of the top layer may be greater after the calculation of each scan information than before the calculation of each scan information.

After the subtraction of each scan information, the method may further include performing integral multiplication to control brightness.

According to other example embodiments, a method of inspecting a defect of a semiconductor device includes: setting at least two conditions under which e-beams are irradiated onto a semiconductor device through an electron microscope, in a computer; selecting a first one of the set conditions; controlling the intensity of e-beams according to the set condition; irradiating e-beams onto the semiconductor device to emit secondary electrons from a predetermined portion of the semiconductor device according to the intensity of the e-beams; supplying current to a detector to collect the emitted secondary electrons in the detector due to the supplied current and generate a secondary electron signal; converting the secondary electron signal into an image signal and displaying a pattern image on a monitor; automatically storing scan information on the pattern image along with positional information on the predetermined portion of the semiconductor device in a computer storage device; and reviewing a defect using a monitor.

The method may further include: selecting a second one of the set conditions; and automatically storing scan information obtained under the second set condition along with the stored positional information.

The method may further include: inputting a calculation condition in the computer; calculating scan information obtained under the selected conditions using a computer calculator to form a new integrated pattern image; and simultaneously scanning and automatically storing the new integrated pattern image.

A clearer pattern image may be obtained by varying the calculation condition, and the calculation condition may be subtraction.

The condition under which the e-beams are irradiated may depend on the intensity of the e-beams, which is varied by applying a low voltage or a high voltage or supplying a high current or an extra current.

According to other example embodiments, an apparatus to inspect a defect of a semiconductor device includes: an e-beam source generator configured to generate e-beams and focus the e-beams onto a semiconductor device; a signal processor configured to process a secondary electron signal generated by collision of the e-beams with the semiconductor device; an image storage configured to multi-process the secondary electron signal, scan a pattern image in response to the secondary electron signal, and store scan information along with positional information on each of pattern images; and an image changer configured to calculate multiple signals and integrate respective pattern images.

The e-beam source generator may include: an electron gun configured to generate the e-beams; a condensing module configured to condense the e-beams to control the intensity of the e-beams; a scanning coil configured to control a deflection angle of the e-beams; and an object lens configured to control a focal length of the e-beams.

The signal processor may include: a detector configured to detect the secondary electron signal generated by the collision of the e-beams with the semiconductor device; and an image processor configured to convert the detected secondary electron signal into information on a pattern image.

The image storage may be a computer unit configured to scan the respective pattern images under set conditions under which the e-beams are irradiated, and automatically store scan information on the pattern images.

The image changer may be a computer unit configured to add or subtract the respective stored pattern images in response to the multiple signals.

According to other example embodiments, a method of inspecting a defect of a semiconductor device, includes: causing an interaction between electrons and atoms at each layer of plural layers of a semiconductor substrate to generate respective signals; detecting the generated signals for each layer to form pattern images for each of the layers; and integrating the pattern images from the detected signals to improve image quality at predetermined layers.

BRIEF DESCRIPTION OF THE DRAWINGS

The above and/or other features and utilities of the present general inventive concept will become apparent and more readily appreciated from the following description of the exemplary embodiments, taken in conjunction with the accompanying drawings, in which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In embodiments of the present general inventive concept, an inspection process is performed to detect a defect of a pattern formed on a semiconductor substrate. The defect needs to be removed to avoid degrading the operating characteristics of a semiconductor device. The pattern formed on the semiconductor substrate may have various defects, such as scratches, particles, or an un-removed portion of a material layer formed on the semiconductor substrate. Accordingly, the defect may be detected in consideration of whether the pattern has an originally intended shape or line width.

The inspection process may be performed employing various inspection apparatuses, for example, an apparatus using electron beams (e-beams), such as a scanning electron microscope (SEM), a transmission electron microscope (TEM), or an e-beam inspection apparatus. In addition, the inspection process may be conducted employing a secondary ion mass spectrometer using ionic beams or a surface inspection system using laser beams. However, only an inspection process using a SEM will be described as an example.

A SEM may include an e-beam source generator and a signal processor. The e-beam source generator may generate e-beams and focus the e-beams onto a semiconductor substrate, and the signal processor may process a secondary electron signal generated due to collision of e-beams with the semiconductor substrate.

Although not shown, the e-beam source generator may include an electron gun configured to generate e-beams, a condensing module configured to condense the e-beams to control the intensity of the e-beams, a scanning coil configured to control a deflection angle of the e-beams, and an object module configured to control a focal length of the e-beams.

Figure 1:
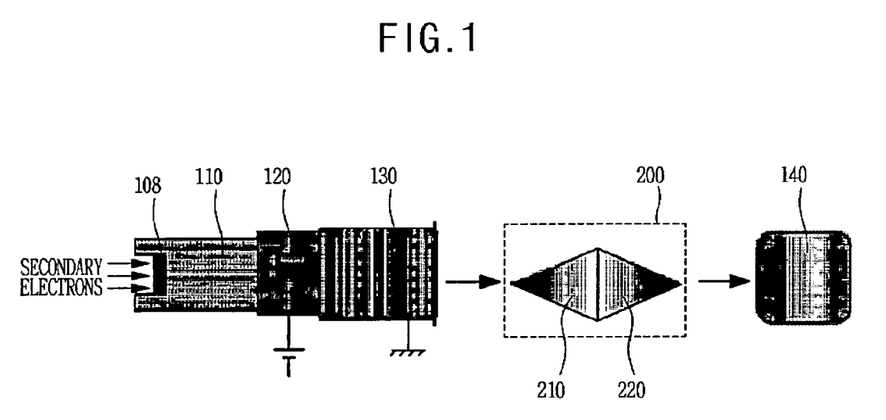
FIG. 1 is a block diagram of a signal processor to inspect defects of a semiconductor device according to example embodiments.

Referring to FIG. 1, the signal processor may include a detector 110, a converter 120, an amplifier 130, and an image processor (not shown). The detector 110 may detect secondary electrons, which are generated due to the collision of e-beams with the semiconductor substrate. The detector 110 may detect such electrons using a scintillator 108. The converter 120 may convert a secondary electron signal into an electrical signal. The amplifier 130 may amplify the electrical signal. The image processor may convert the amplified electrical signal into a digital signal to display a pattern image on a monitor (i.e., cathode-ray tube (CRT)) 140.

Accordingly, e-beams generated by the electron gun may sequentially pass through the condensing module, the scanning module, and the object module and be focused on the semiconductor substrate. Thereafter, the secondary electrons emitted from the semiconductor substrate may be detected by the detector. A signal corresponding to the detected secondary electrons may be converted into a digital signal to allow an operator to visually confirm a defect from the detected pattern image.

In order to precisely measure a defect, it is important to clearly obtain a pattern image. If the pattern image is unclear, it is impossible to precisely detect a defect. With an increase in the integration density of semiconductor devices, the semiconductor devices have been gradually downscaled and the linewidth of patterns has been reduced in size to several tens of nm. As a result, defects also have been reduced to several nm.

In particular, when a semiconductor device has a stacked structure, since the semiconductor device is etched to have a desired pattern, the pattern may be embossed or engraved according to an extent of the etching to have a surface topology. Thus, not only a top layer having a great height but also an under layer having a small height may have defects. Because the top layer casts a shadow on the under layer, it is more difficult to detect a defect generated in the under layer than in the top layer which has no obstructions regardless of reduction in a horizontal interval between the layers. Even if a defect is detected in the under layer despite the difficulty during an inspection process, it is easy to miss the defect during a subsequent review process due to such obstructions.

Figure 2:
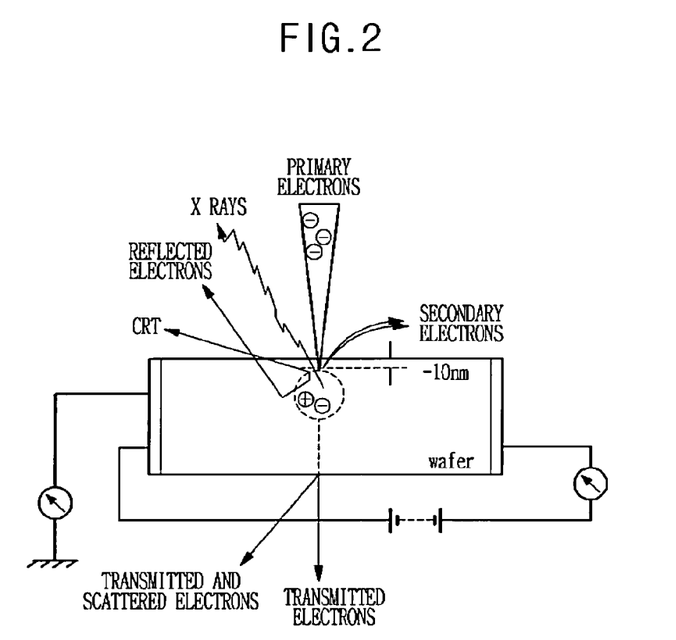
FIG. 2 is a cross-sectional view showing the operating principles of a scanning electron microscope (SEM) according to example embodiments.

The operating principles of a SEM will now be briefly described with reference to FIG. 2.

When e-beams are irradiated onto a semiconductor substrate, an interaction may occur between electrons and atoms of the semiconductor substrate to generate various types of signals, such as X rays, reflected electrons, cathode glow, and secondary electrons. Among these, a detection signal corresponding to secondary electrons may be detected by a scintillator. Since the secondary electrons have a low energy, they are generated from only a shallow region of the surface of the semiconductor substrate. The signal of the secondary electrons detected by the scintillator may be amplified by an amplifier and converted into an electrical signal at the same time. The electrical signal may be converted into a digital signal by an image processor so that a pattern image can be confirmed via a monitor (or CRT).

In this case, it is necessary to control the intensity of e-beams to observe the pattern image more clearly via the monitor (or CRT).

Figure 3:
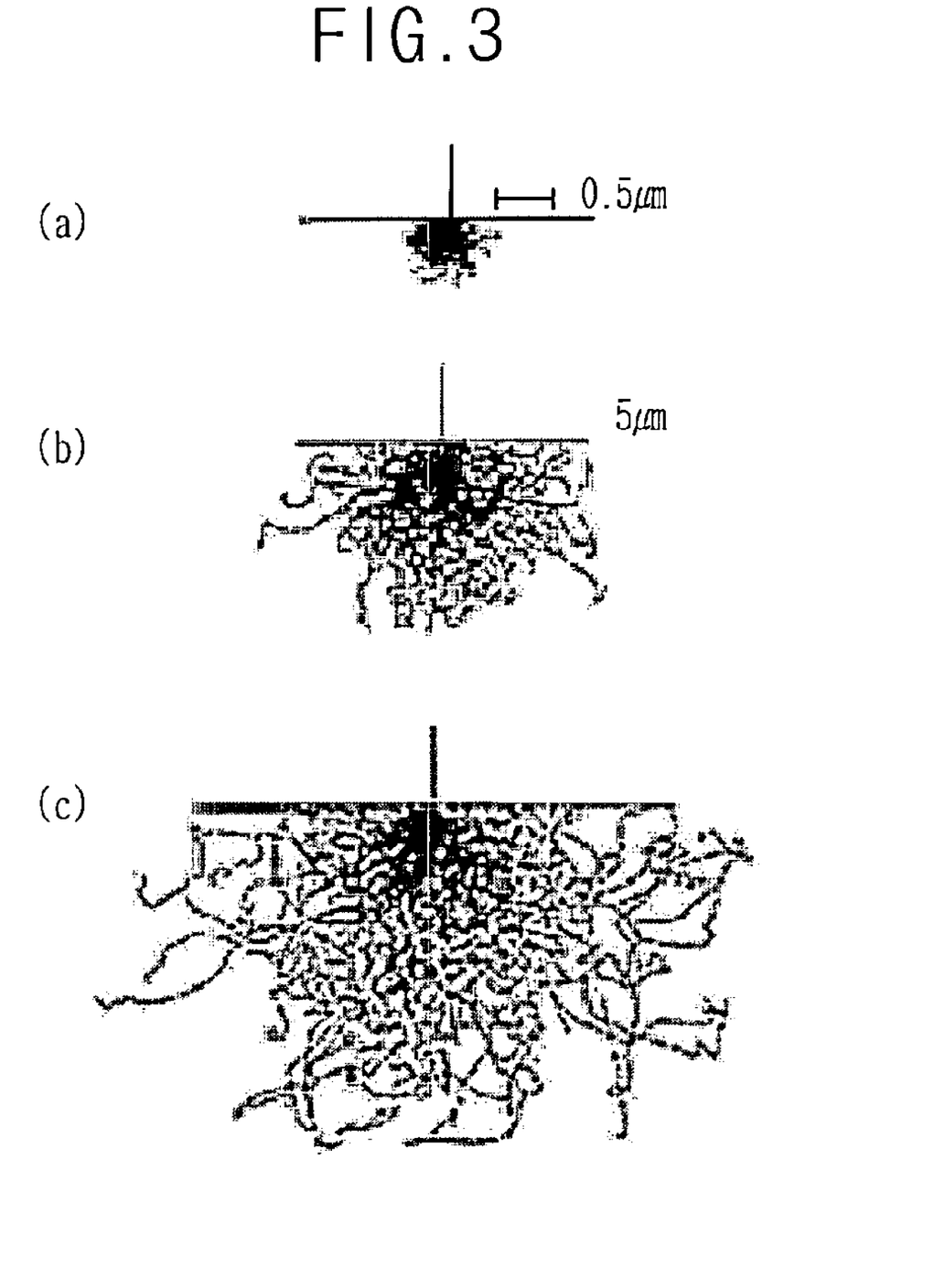
FIG. 3 is a cross-sectional view showing an interaction volume relative to the intensity of a voltage according to example embodiments.

The SEM employs e-beams instead of rays of light. Accordingly, the SEM includes two features as follows. First, the intensity of e-beams is proportional to an acceleration voltage. In other words, as a voltage increases, the energy of incident electrons (or primary electrons) increases and thus, the incident electrons penetrate deeper into the semiconductor substrate and an interaction volume increases, as shown in FIG. 3. Referring to FIG. 3, the interaction volume is respectively different in cases (a), (b), and (c). Second, the intensity of e-beams may vary with the intensity of an applied current. That is, the depth of incident electrons penetrating the semiconductor substrate increases with an increase in the intensity of the current supplied to a condensing module.

Meanwhile, a method of inspecting a defect may vary with the shape and structure of the pattern.

Figure 4:
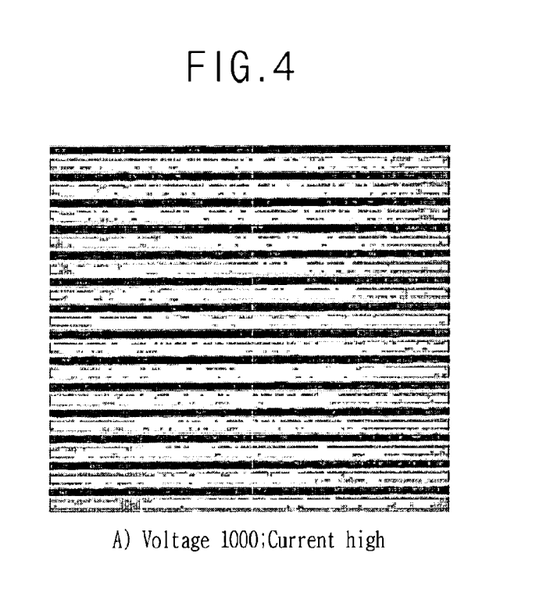
FIG. 4 is a SEM photograph showing a line-and-space-type pattern image obtained under conditions of 1000 V and a high current, according to example embodiments.
Figure 5:
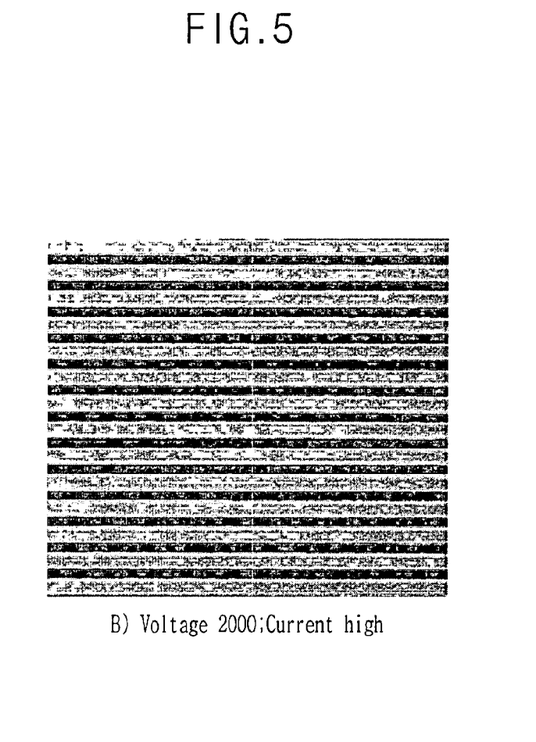
FIG. 5 is a SEM photograph showing a line-and-space-type pattern image obtained under conditions of 2000 V and a high current, according to example embodiments.
Figure 6:
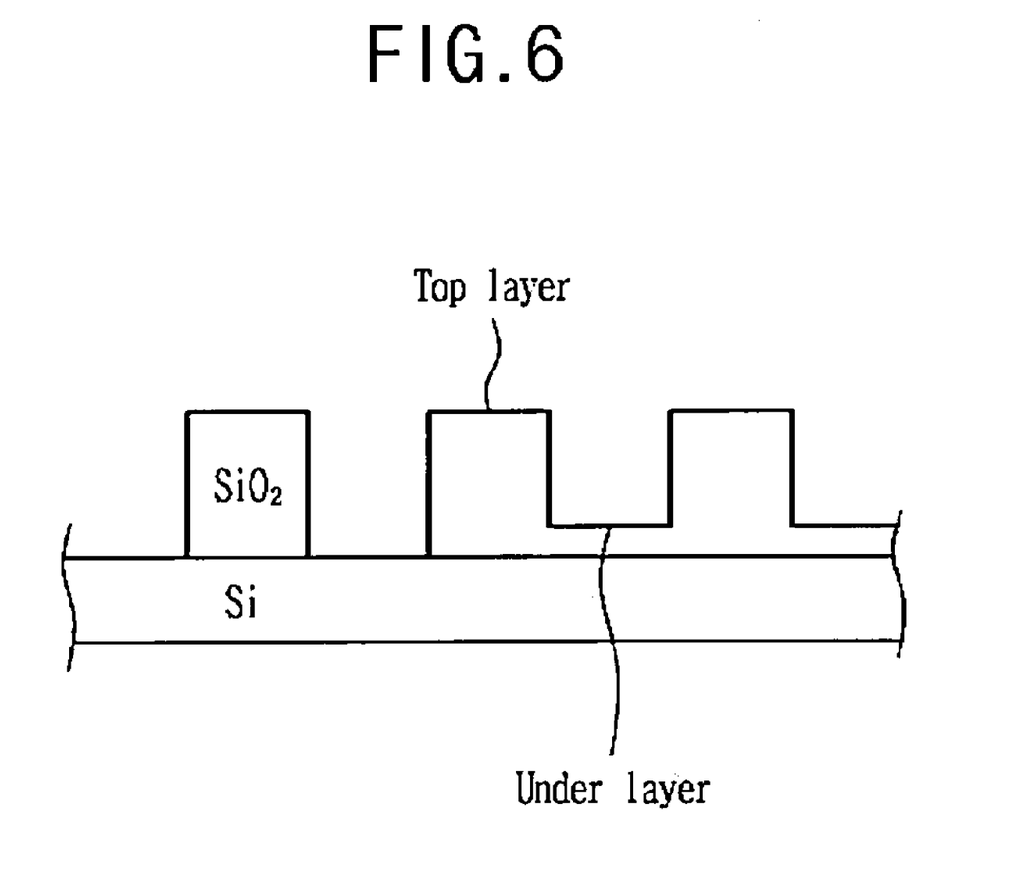
FIG. 6 is a cross-sectional view of a portion of the line-and-space-type pattern images of FIGS. 4 and 5.

For example, a step height may occur due to a selective epitaxial growth (SEG) process in which silicon is not grown on an insulating layer but selectively grown in an exposed portion of a silicon substrate. In addition, the method of inspecting a defect may be applied to any kind of a semiconductor pattern having a step height in the surface thereof. For example, FIGS. 4 and 5 show cases in which step heights occur due to various patterns formed in an insulating ($SiO_2$) layer stacked on a silicon substrate. Also, FIG. 6 is a cross-sectional view of a portion of the patterns of FIGS. 4 and 5. From the cross-sectional view, the insulating ($SiO_2$) layer may have a step height, that is, a line-and-space shape. A top layer and an under layer may be formed to respectively correspond to a line and a space. In FIGS. 4 and 5, a bright portion corresponds to the top layer (or line), while a dark portion corresponds to the under layer (or space).

When e-beams are irradiated onto a semiconductor substrate on which a single crystalline silicon thin layer is selectively formed, since the amount of secondary electrons depends on a surface material or surface topology of the semiconductor substrate, a defect in the top layer is clearly observed, but a defect in the under layer is not as easily noticeable as the defect in the top layer. Thus, it is difficult to detect the defect in the under layer.

In the present embodiment, a plurality of pattern images may be scanned and calculated in order to precisely detect the defect in the under layer. For example, by irradiating e-beams onto the semiconductor substrate having the selectively grown single crystalline silicon layer at different intensities, at least two pattern images may be scanned and subtracted.

To begin with, the state of each of the pattern images may be examined and results of subtraction of the pattern images may be analyzed.

Referring to FIG. 4, when a low voltage of about 1000 V was applied and a high current was supplied under condition A, it can be observed that a pattern image was clear in a top layer, while the pattern image was dark in an under layer.

Referring to FIG. 5, when a high voltage of about 2000 V was applied and a high current was supplied under condition B, it can be similarly observed that the pattern image was clear in a top layer, while the pattern image was dark in an under layer.

Figure 7:
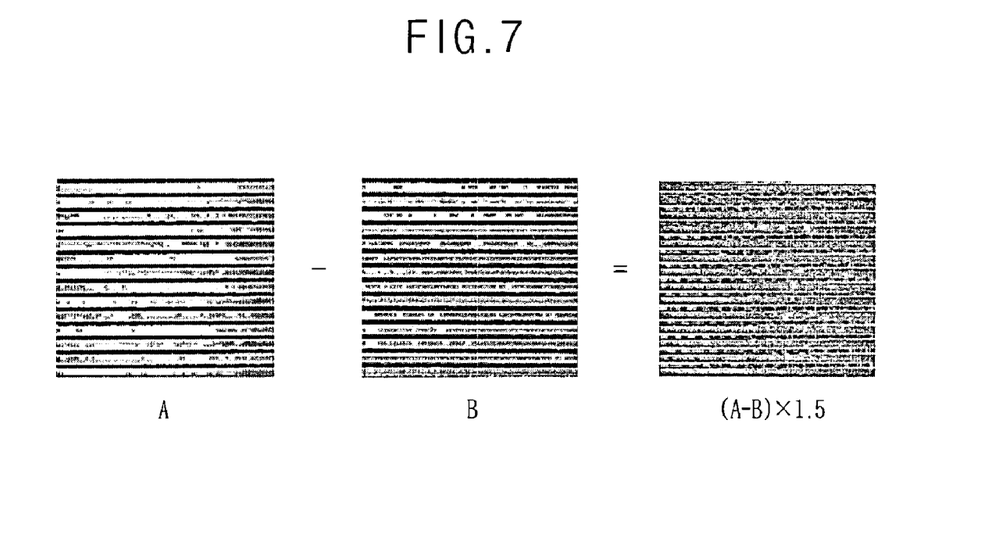
FIG. 7 is a SEM photograph showing a pattern image obtained by calculating the conditions of FIGS. 4 and 5.

Referring to FIG. 7, when subtraction was performed on the pattern image obtained under condition B and the pattern image obtained under condition A, it can be seen that two pattern images were integrated so that the pattern image in the under layer became as clear as the pattern image in the top layer.

The result shown in FIG. 7 may be obtained on the following specific principles.

As described above, when e-beams are irradiated on a semiconductor substrate using a SEM, secondary electrons may be emitted from the semiconductor substrate and detected by a detector of the SEM. A signal corresponding to the secondary electrons detected by the detector may be displayed on a monitor, thereby obtaining a pattern image. In this case, it can be seen that the pattern image may vary with the signal corresponding to the secondary electrons detected by the detector. That is, the intensity of e-beams may vary with an applied voltage or current. Also, as the signal corresponding to the secondary electrons increases in proportion to the intensity of the e-beams, the pattern image becomes clearer. However, even if the pattern image is generally improved, the under layer becomes relatively darker than the top layer, so that only the pattern image of the top layer is improved, while the pattern image of the under layer is degraded.

Accordingly, when subtraction is performed on two pattern images obtained under different conditions, only the pattern image formed in the under layer may be improved.

In the case of condition A, secondary electrons of the top layer have a signal value of 100, and secondary electrons of the under layer have a signal value of 5, since a ratio of the signal value of the secondary electrons in the under layer to that of the secondary electrons in the top layer is only 5%, the pattern image formed in the under layer looks obviously darker.

In the case of condition B where a high voltage was applied, the signal value of secondary electrons in the top layer increases to 150, and the signal value of secondary electrons in the under layer increases to 20. In this case, although the pattern image is generally clearer, the ratio of the signal value of secondary electrons in the under layer to that of secondary electrons in the top layer is only 15%, and the pattern image formed in the under layer is still dark.

When subtraction is performed on the pattern images obtained under conditions A and B, the signal value of the top layer is only 50, while the signal value of the under layer is 15, so that the ratio of the signal value of the under layer to that of the top layer is as much as 30%. By contrast, the ratio of the signal value of the top layer to that of the under layer is naturally reduced to 70%. Thus, the pattern image of the under layer becomes clearer.

As described above, two respective pattern images are scanned under different conditions by varying a voltage or current applied to the same position, and subtraction is performed on the pattern images to generate a new pattern image having an improved brightness in the under layer.

To do this, a SEM is required as described above. An optical microscope allows an operator to see an actual image, while an electron microscope precludes an operator from seeing an actual image and allows the operator to see the image only through a monitor. Accordingly, in order to see the actual image, the detector 110, the amplifier 130, and the image processor are needed. The detector 110 may detect secondary electrons emitted from the semiconductor substrate. Also, the amplifier 130 may convert a current signal corresponding to the detected secondary electrons into a voltage signal and amplify the voltage signal. In addition, the image processor may convert the amplified voltage signal into image information so that the operator may see a pattern image on the monitor 140.

Furthermore, a computer unit 200 may be required. The computer unit 200 may include a storage 210 and a calculator 220. The storage 210 may scan and store respective pattern images obtained under different conditions, and the calculator 220 may add, subtract or multiply the respective stored pattern images.

In this case, in order to obtain various pattern images, a plurality of conditions may be previously selected in consideration of several expected variables instead of selecting the conditions according to circumstances. Thus, an operator may input and store several set conditions and easily select at least one out of the conditions using a button.

Meanwhile, defects in a pattern of a semiconductor device may include not only a line-and-space gate pattern failure but also a via contact failure. As the number of layers stacked on a semiconductor device increases, the number of via contacts used to connect interlayer interconnections increases, and via contact failures also gradually increase. In particular, with an increase in the integration density of semiconductor devices, the design rule of vias decreases and detecting via contact failures becomes more difficult.

Figure 8:
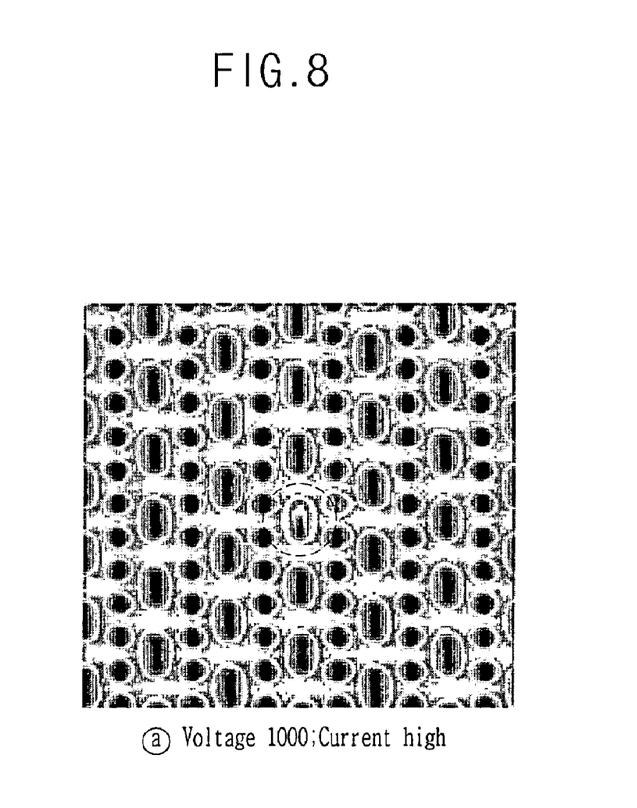
FIG. 8 is a SEM photograph showing a pattern image of a via contact layer obtained under conditions of 1000 V and a high current, according to other example embodiments.
Figure 9:
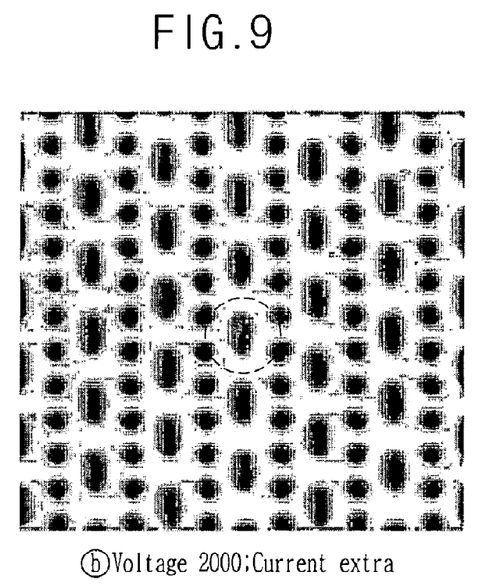
FIG. 9 is a SEM photograph showing a pattern image of a via contact layer obtained under conditions of 2000 V and an extra current, according to other example embodiments
Figure 10:
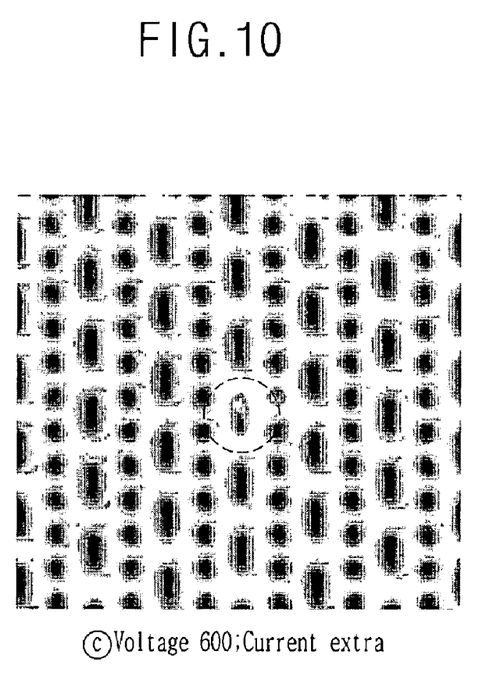
FIG. 10 is a SEM photograph showing a pattern image of a via contact layer obtained under conditions of 600 V and an extra current, according to other example embodiments.

Referring to FIGS. 8 through 10, the following contact pattern images may be obtained by setting various conditions in order to inspect via contact failures.

When a medium voltage of about 1000 V was applied and a high current was supplied under condition "a" of FIG. 8, it can be observed that a pattern image was relatively clear in a top layer corresponding to an upper portion of an insulating layer, while the pattern image was dark in an under layer corresponding to a via contact.

When a high voltage of about 2000 V was applied and an additional current higher than the high current was supplied under condition "b" of FIG. 9, it can be seen that the pattern image in the under layer corresponding to the via contact was slightly improved but still dark.

When a low voltage of about 600 V was applied and an additional current was supplied under condition "c" of FIG. 10, it can be seen that the pattern image was dark in both the top layer and the under layer.

Although the present example embodiment describes only three set conditions, the present general inventive concept is not limited thereto, and more various conditions may be set and prepared.

Figure 11:
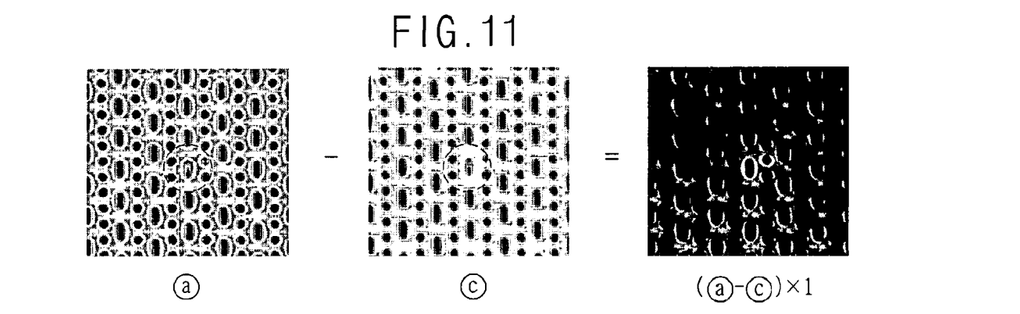
FIG. 11 is a SEM photograph showing a pattern image integrated by subtracting the image patterns obtained under the conditions of FIGS. 8 and 10.
Figure 12:
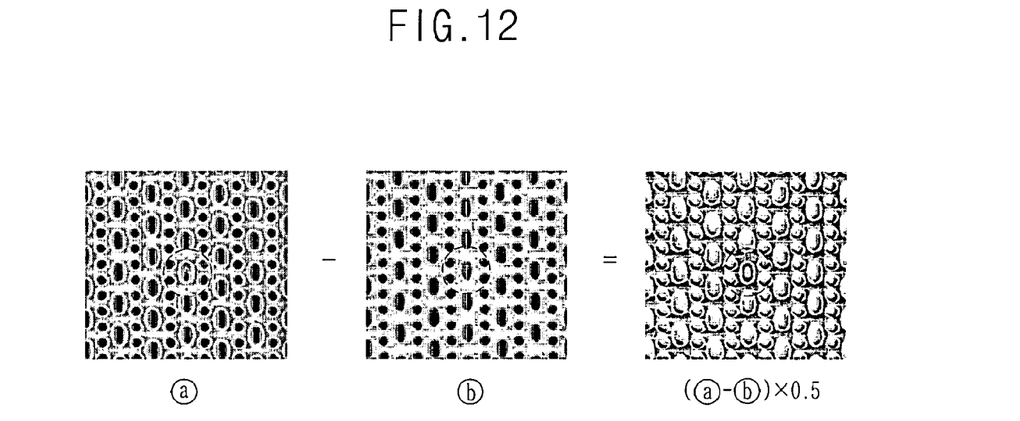
FIG. 12 is a SEM photograph showing a pattern image integrated by subtracting the image patterns obtained under the conditions of FIGS. 8 and 9.

FIG. 11 is a SEM photograph showing a pattern image integrated by subtracting pattern images obtained under the conditions "a" and "c" of FIGS. 8 and 10, and FIG. 12 is a SEM photograph showing a pattern image integrated by subtracting pattern images obtained under the conditions "a" and "b" of FIGS. 8 and 9. As shown in FIGS. 11 and 12, it is obvious that the integrated pattern images of an under layer became brighter and clearer due to the subtraction.

However, the integrated pattern image obtained by subtracting the image patterns obtained under the conditions "a" and "c" of FIGS. 8 and 10 was clearer than that obtained by subtracting the image patterns obtained under the conditions "a" and "b" of FIGS. 8 and 9 because a ratio of the signal value in the layer to the signal value in the top layer is larger.

Figure 13:
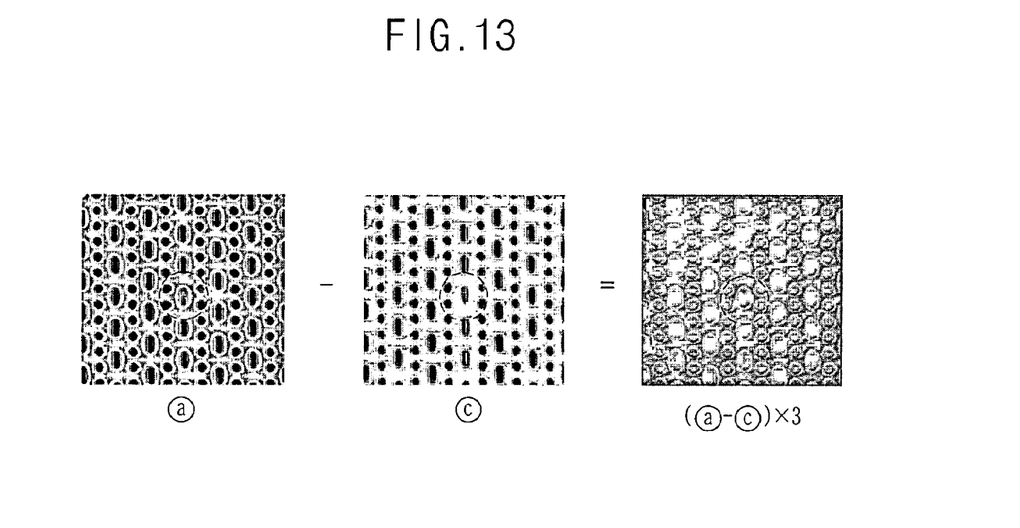
FIG. 13 is a SEM photograph showing an integrated pattern image equal to an integral multiple of an image pattern obtained by subtracting the image patterns obtained under the conditions of FIGS. 8 and 10.

In addition to subtraction, the brightness of a pattern image may be controlled by rational or integral multiplication. FIG. 13 is a SEM photograph showing an integrated pattern image equal to an integer multiple (n) of a pattern image obtained by subtracting the pattern images obtained under the conditions "a" and "c" of FIGS. 8 and 10. Thus, it can be seen that the pattern image in an under layer can be clearer due to the multiplication.

Accordingly, an operator may appropriately select at least two out of various set conditions and combine the selected conditions to determine an optimum condition.

The aforementioned storing and calculating process will now be described with reference to FIGS. 14 through 16.

Figure 14:
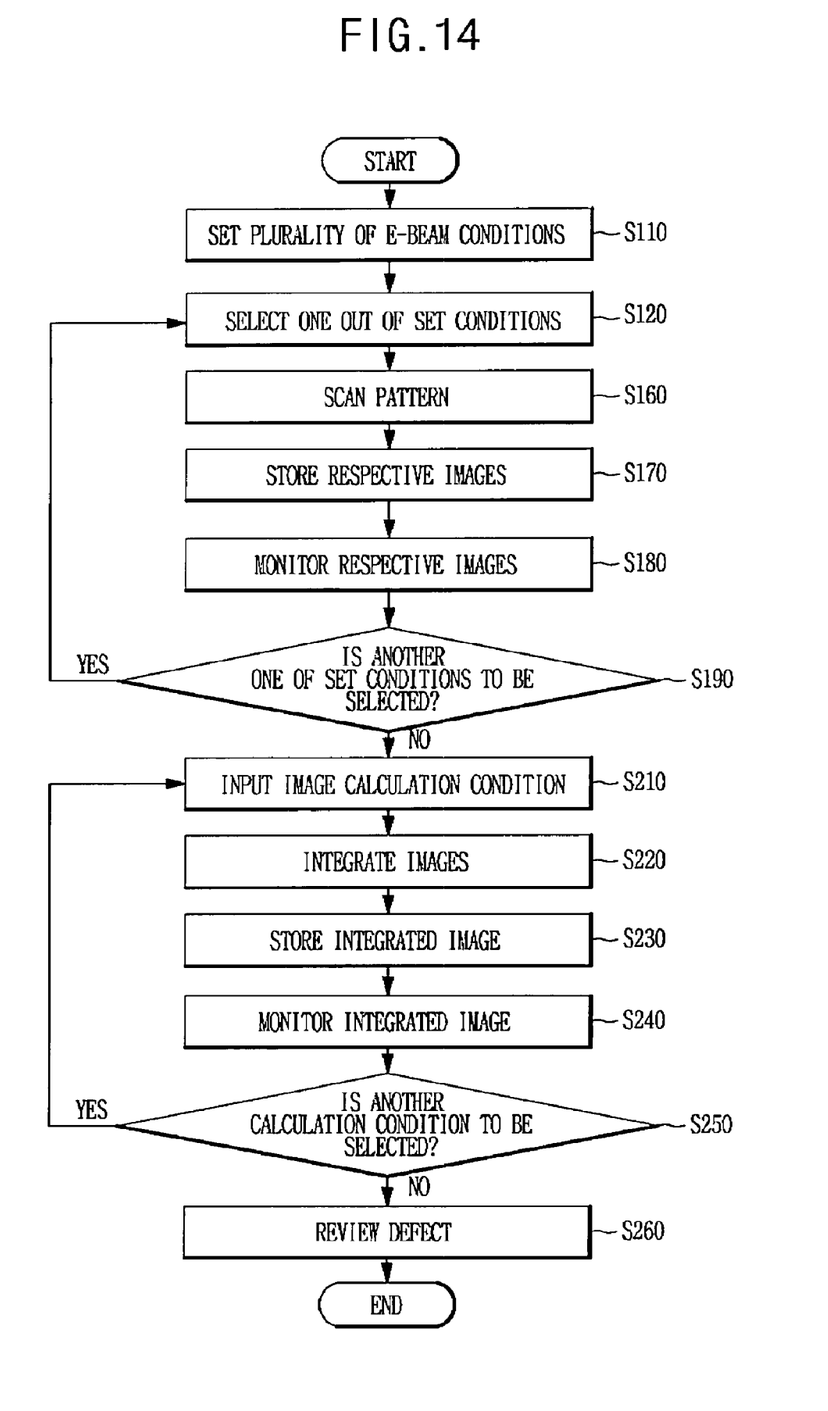
FIGS. 14 through 16 are flowcharts illustrating processes of calculating a pattern image.

Referring to FIG. 14, a plurality of conditions under which e-beams are irradiated may be set (operation S110), one condition may be selected out of the set conditions (operation S120), and a pattern may be scanned under the selected condition (operation S160). An individual pattern image may be monitored (operation S170), and stored (operation S180). Another condition may be selected out of the set conditions (operation S190), and the above-described process may be repeated.

Figure 15:
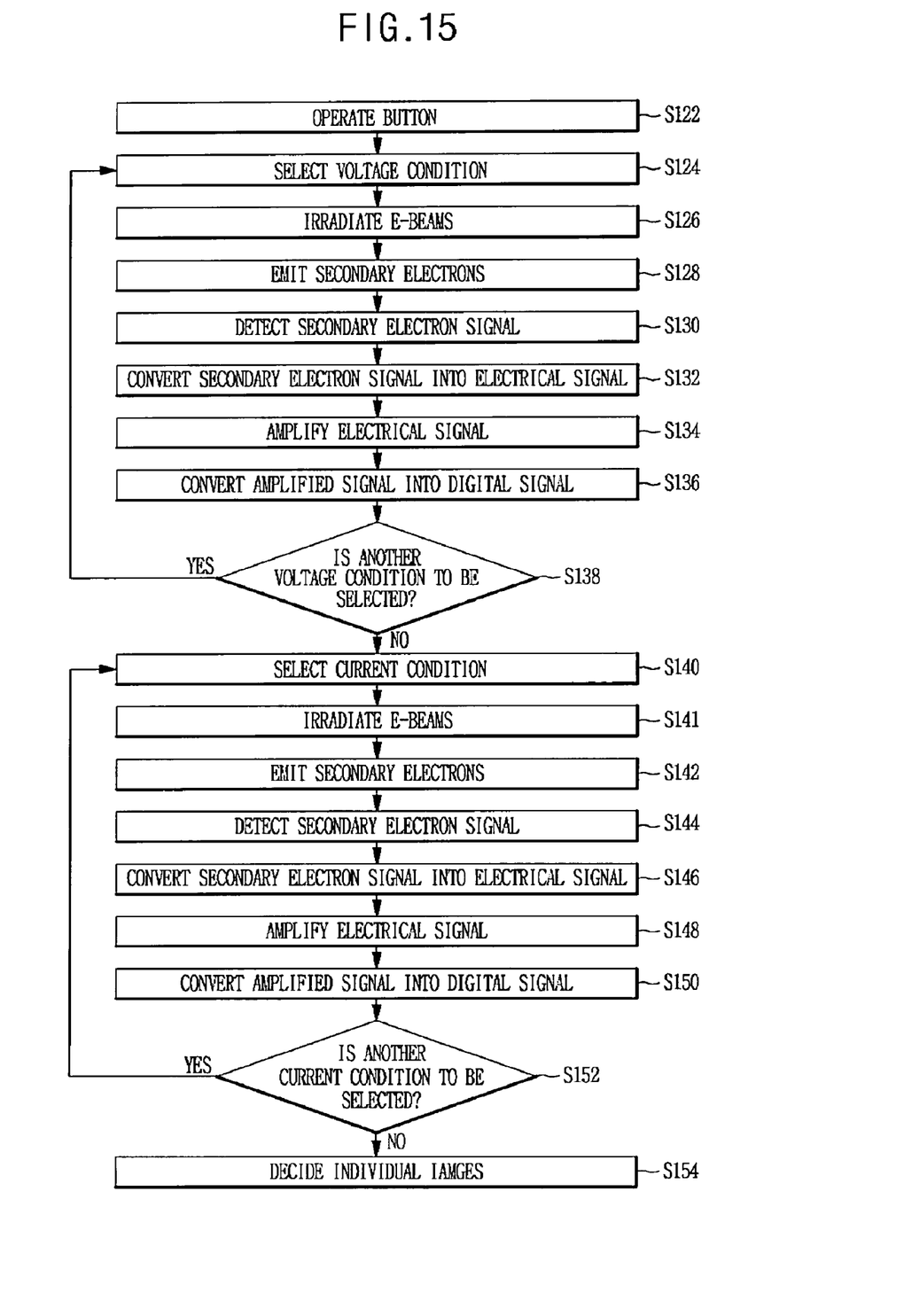

Referring to FIG. 15, an operator may control the intensity of e-beams by setting several conditions. The operator may simply manipulate a button (operation S122) to select a voltage condition (operations S122 to S138) or select a current condition (operations S140 to S154). When the voltage condition is selected (operation S124), e-beams may be irradiated through a condensing lens, a scanning coil, and an object lens onto a semiconductor substrate (operation S126). Thus, secondary electrons may be emitted from a predetermined portion of the semiconductor substrate irradiated with the e-beams (operation S128). In this case, by supplying current to a detector, the emitted secondary electrons may be collected in the detector due to the current supplied to the detector so that the detector can detect a secondary electron signal (operation S130). The detected secondary electron signal may be converted into an electrical signal (operation S132), amplified (operation S134), and converted into image data (operation S136) so that a pattern image may be displayed on a monitor. The operator may confirm the pattern image with his or her naked eye. Subsequently, the operator may select the current condition (operations S140 to S152) and thus, an individual pattern image may be decided (operation S154).

As described above, when the operator selects a certain condition, a pattern may be scanned under the selected condition based on stored positional information (operation S160), and each scan information may be automatically stored (operation S170). Thereafter, the operator may review a pattern image processed by an image processor through a monitor with his or her naked eye (operation S180). That is, when the operator marks a predetermined portion to be inspected and inputs one of the set conditions using a button, scan information may be automatically stored along with positional information of the predetermined portion and monitored.

Figure 16:
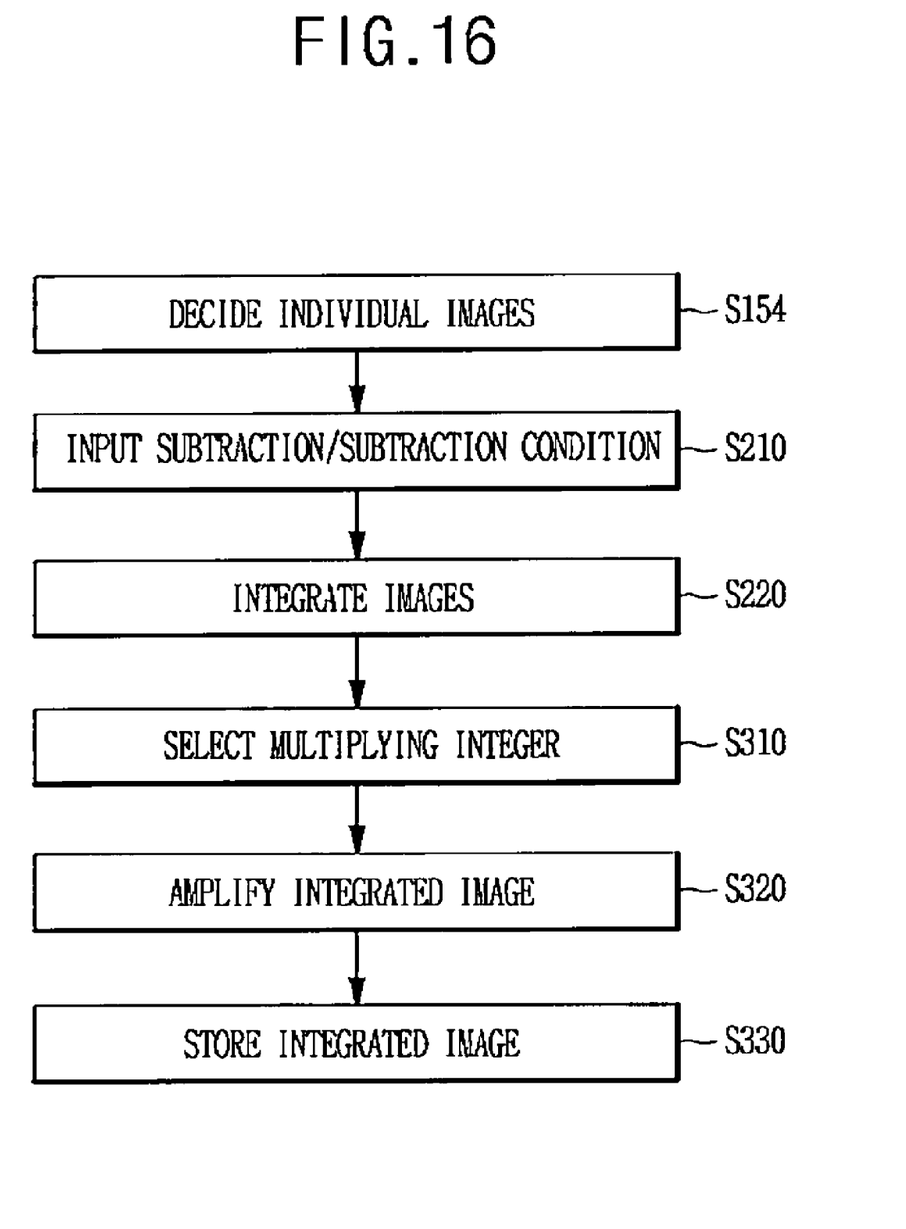

Referring to FIGS. 14 and 16, when the operator inputs a calculation condition to a computer (operation S210), a calculator of the computer may calculate scan information corresponding to the input condition (operation S220) and automatically store the scan information (operation S230) so that a new integrated pattern image can be output on the monitor (operation S240). When another calculation condition is input to the computer (operation S250), a clearer pattern image may be obtained from an under layer and a reviewing process (operation S260) may be facilitated.

In this process, when the operator marks a predetermined portion to be inspected and selects one out of previously set conditions, the computer may scan and output a pattern image according to the selected condition based on positional information of the predetermined portion and automatically store the pattern image. When the operator inputs calculation information (operation S210), each of scan information may be integrated by a calculation process to generate and output a new pattern image (operation S220). Also, the calculation process may be followed by integral (n) multiplication (operation S310) so that the integrated pattern image may be amplified (operation S320). Thereafter, the integrated pattern image may be automatically stored (operation S330). As a result, an improved pattern image may be obtained.

When conditions under which e-beams are irradiated are set, calculation information may be previously input so that scanned images may be calculated based on the calculation information. In this case, the operator has only to mark a predetermined portion to be inspected and select appropriate conditions so that an optimum pattern image can be automatically generated by storage and calculators of a computer.

As described above, by varying an acceleration voltage or current, the energy of primary electrons generated due to e-beams may be increased and a volume that interacts with atoms of a semiconductor substrate may also be increased, so that a secondary electron signal may increase. Although a pattern image is generally improved, the brightness of a recess (or under layer) of a pattern may be degraded as compared with a projection (or top layer) of the pattern. However, when at least two pattern images having different signal values are scanned and subtracted, signal values of projections of patterns become smaller than those of recesses thereof. As a result, the signal values of pattern images in the projections may counterbalance each other, while the signal values of the pattern images in the recesses may increase. Therefore, a new pattern image having a clearer recess may be obtained by calculating the pattern images.

As described above, the construction and method according to the present example embodiment can have the following effects.

By calculating a plurality of pattern images, values of secondary electron signals in a projection of a top layer can counterbalance each other, while values of secondary electron signals in a recess of an under layer can be amplified, so that the recess of the under layer can be as clear as the projection of the top layer and a new pattern image can be generated.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of inspecting a defect of a semiconductor device, comprising:
fabricating a semiconductor device by etching a desired pattern in a stacked layer, the pattern having a step height between a top layer and an under layer;
scanning a first pattern image of the top layer and the under layer using a first electron beam having a first irradiation characteristic;
scanning a second pattern image of the top layer and the under layer using a second electron beam having a second irradiation characteristic different from the first irradiation characteristic;
processing the first and second pattern images and storing scan information of the first and second pattern images of the top layer and the under layer;
integrating image information of the first and second pattern images to form an integrated image; and
reviewing a defect included in the pattern of the semiconductor device using the integrated image.

2. The method of claim 1, wherein the fabricating of the semiconductor device comprises performing a selective epitaxial growth (SEG) process in which silicon is not grown in an insulating layer but selectively grown on an exposed portion of a silicon substrate, wherein the grown portion of the silicon substrate and the ungrown insulating layer correspond to the top layer and the under layer, respectively.

3. The method of claim 1, wherein the fabricating of the semiconductor device comprises forming a via contact layer to connect interlayer interconnections of the insulating layer of the semiconductor layer having a stacked structure,
wherein an upper surface of the insulating layer and an upper surface of the interconnection correspond to the top layer and the under layer, respectively.

4. The method of claim 1, wherein the scanning of the first and second pattern images comprises:
irradiating e-beams onto the semiconductor device;
generating secondary electrons from the semiconductor device;
detecting a secondary electron signal using a scintillator of a detector;
converting the secondary electron signal into an electrical signal;
amplifying the secondary electron signal using an amplifier;
converting the electrical signal into a digital signal; and
displaying the pattern images on a monitor.

5. The method of claim 1, wherein the irradiation characteristic of the second electron beam is changed from that of the first electron beam to correspond to at least one expected variable, and
an operator selects the irradiation characteristic from among a plurality of characteristics using a button during an operation.

6. The method of claim 1, wherein the different irradiation characteristics correspond to different e-beam intensities; and
integrating the image information includes combining the images of the first and second patterns at the different intensities of the e-beams to generate the integrated image.

7. The method of claim 1, wherein processing the first and second pattern images includes subtracting one of the first and second pattern images from the other of the first and second pattern images.

8. The method of claim 7, wherein the subtraction is performed to increase a ratio of a pattern image of the under layer to a pattern image of the top layer,
wherein the ratio is indicated by a secondary electron signal.

9. The method of claim 8, wherein a ratio of a secondary electron signal of the under layer to a secondary electron signal of the top layer is greater after the calculating of each scan information than before the calculating of each scan information.

10. The method of claim 8, further comprising, after the calculating of each scan information using the subtraction, controlling brightness by performing integral multiplication.

11. A method of inspecting a defect of a semiconductor device, comprising:
setting in a computer at least two conditions under which electron beams (e-beams) are irradiated onto a semiconductor device;
selecting a first one of the set conditions;
controlling the intensity of e-beams according to the set condition;
irradiating e-beams onto the semiconductor device to emit secondary electrons from a predetermined portion of the semiconductor device according to the intensity of the e-beams;
supplying current to a detector to collect the emitted secondary electrons in the detector due to the supplied current and generate a secondary electron signal;
converting the secondary electron signal into an image signal and displaying a pattern image on a monitor;
automatically storing scan information on the pattern image along with positional information on the predetermined portion of the semiconductor device in a computer storage device;
selecting a second one of the set conditions;
automatically storing scan information obtained by irradiating e-beams onto the semiconductor device according to the second set condition along with stored positional information;
displaying on the monitor an integrated image generated using the scan information corresponding to the first one of the set conditions and the second one of the set conditions; and
reviewing a defect using the monitor.

12. The method of claim 11, further comprising:
inputting a calculation condition in the computer;
calculating scan information obtained under the selected conditions using a computer calculator to form a new integrated pattern image; and
simultaneously scanning and automatically storing the new integrated pattern image.

13. The method of claim 12, wherein a clearer pattern image in an under layer is obtained by varying the calculation condition,
wherein the calculation condition is subtraction.

14. The method of claim 13, wherein the condition under which the e-beams are irradiated depends on the intensity of the e-beams, which is varied by applying a low voltage or a high voltage or supplying a high current or an extra current.

15. A method of inspecting a defect of a semiconductor device, comprising:
causing an interaction between electrons and atoms at each layer of plural layers of a semiconductor substrate to generate a first scan signal;
causing an interaction between electrons and atoms at each layer of the plural layers of the semiconductor substrate by changing a characteristic of an electron beam (e-beam) to generate a second scan signal;
detecting the generated scan signals of each layer to form first and second pattern images of each of the layers corresponding to the first and second scan signals, respectively; and
integrating the first and second pattern images from the detected signals to generate an integrated image having an improved image quality at predetermined layers.

16. The method of claim 15, wherein the causing an interaction between electrons and atoms at each layer is performed by varying at least one of a voltage and current of an e-beam directed at the semiconductor device.

17. The method of claim 16, wherein each of the plurality of layers has a step height therebetween.

18. The method of claim 17, wherein integrating the pattern images from the detected signals is performed by calculating the pattern images using subtraction at different intensities of the voltage and current of the e-beam.

19. The method of claim 18, wherein calculating the pattern images using subtraction is performed by increasing a ratio of the detected signal of the pattern image of an under layer to the pattern image of a top layer.

* * * * *